United States Patent
Watson

(10) Patent No.: US 6,784,555 B2
(45) Date of Patent: Aug. 31, 2004

(54) DIE ATTACH ADHESIVES FOR SEMICONDUCTOR APPLICATIONS UTILIZING A POLYMERIC BASE MATERIAL WITH INORGANIC INSULATOR PARTICLES OF VARIOUS SIZES

(75) Inventor: Michael John Watson, Midland, MI (US)

(73) Assignee: Dow Corning Corporation, Midland, MI (US)

( * ) Notice: Subject to any disclaimer, the term of this patent is extended or adjusted under 35 U.S.C. 154(b) by 76 days.

(21) Appl. No.: 09/954,528

(22) Filed: Sep. 17, 2001

(65) Prior Publication Data

US 2003/0057538 A1 Mar. 27, 2003

(51) Int. Cl.[7] .......................... H01L 23/48; H01L 21/48
(52) U.S. Cl. ...................... 257/783; 257/788; 257/789; 257/791; 257/792; 257/795; 438/118; 156/329; 156/990
(58) Field of Search ................................ 257/782, 783, 257/788, 789, 791, 792, 793, 795; 156/305, 329, 330; 438/118, 119, 124, 126, 127; 528/31; 524/266, 268, 388, 493, 506, 588

(56) References Cited

U.S. PATENT DOCUMENTS

| | | | |
|---|---|---|---|
| 4,766,176 A | | 8/1988 | Lee et al. .................... 525/100 |
| 5,017,654 A | | 5/1991 | Togashi et al. ............. 525/100 |
| 5,148,266 A | | 9/1992 | Khandros et al. ........... 257/773 |
| 5,173,765 A | * | 12/1992 | Nakayoshi et al. ......... 257/783 |
| 5,254,623 A | * | 10/1993 | Watson ........................ 525/100 |
| 5,342,919 A | * | 8/1994 | Dickens et al. ............. 528/323 |
| 5,346,861 A | | 9/1994 | Khandros et al. ............. 438/15 |
| 5,347,159 A | | 9/1994 | Khandros et al. ........... 257/692 |
| 5,477,611 A | | 12/1995 | Sweis et al. .................. 29/840 |
| 5,488,082 A | | 1/1996 | Dietz et al. .................. 524/403 |
| 5,637,179 A | * | 6/1997 | Nakayama et al. ......... 156/330 |
| 5,668,059 A | * | 9/1997 | Christie et al. ............. 438/118 |
| 5,760,129 A | * | 6/1998 | Lau ............................. 524/732 |
| 5,851,644 A | * | 12/1998 | McArdle et al. ............ 428/213 |
| 5,977,226 A | | 11/1999 | Dent et al. ................... 524/267 |
| 5,982,041 A | * | 11/1999 | Mitani et al. ............... 257/783 |
| 6,056,846 A | * | 5/2000 | Kuhl et al. .................. 156/278 |
| 6,121,368 A | * | 9/2000 | Heying et al. .............. 524/493 |
| 6,124,407 A | * | 9/2000 | Lee et al. .................... 525/478 |
| 6,201,055 B1 | * | 3/2001 | Lutz et al. ................... 524/493 |
| 6,228,935 B1 | * | 5/2001 | Dunaway et al. ........... 524/832 |
| 6,410,642 B1 | * | 6/2002 | Yamakawa et al. ......... 524/847 |
| 6,413,353 B2 | * | 7/2002 | Pompeo et al. .......... 156/307.3 |
| 6,423,172 B1 | * | 7/2002 | McArdle et al. .......... 156/272.2 |
| 6,555,187 B1 | * | 4/2003 | Kitamura .................... 428/1.53 |
| 2003/0071348 A1 | * | 4/2003 | Eguchi et al. ............... 257/723 |

FOREIGN PATENT DOCUMENTS

| | | | | |
|---|---|---|---|---|
| EP | 432502 A2 | * | 6/1991 | .......... C09J/183/07 |
| EP | 1067163 | | 1/2001 | |
| EP | 1101810 | | 5/2001 | |
| JP | 152642 | | 5/1992 | |
| JP | 05021651 A | * | 1/1993 | .......... H01L/23/29 |
| JP | 07014859 A | * | 1/1995 | .......... H01L/21/52 |
| JP | 7-292343 | | 11/1995 | |
| JP | H11-193828 | | 7/1999 | |
| JP | H11-193829 | | 7/1999 | |

* cited by examiner

Primary Examiner—Alonzo Chambliss
(74) Attorney, Agent, or Firm—Robert L. McKeller

(57) ABSTRACT

Die attach adhesives and methods for their use, along with the devices that are obtained by the use of the methods. Using semiconductor chips as an example, the adhesives and the method for using them provides an interface between a chip (die) and the chip support. The method includes creating a space between the chip and the chip support of a given sized opening by using inorganic insulator particles having an average particle size of 1 $\mu$m to 1000 $\mu$m and a major axis to minor axis ratio of about 1.0 to 1.5.

14 Claims, 3 Drawing Sheets

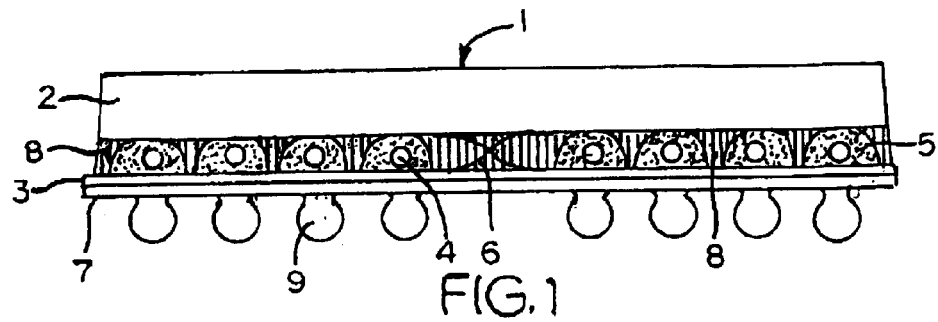
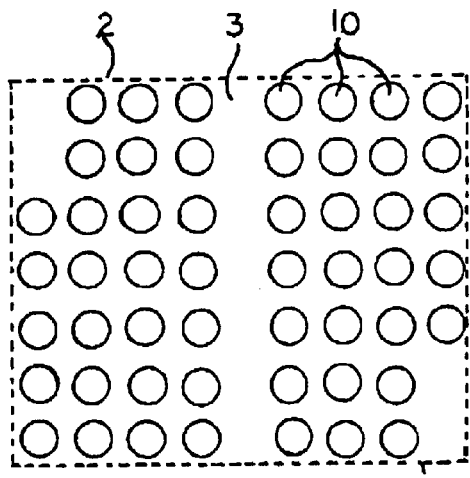
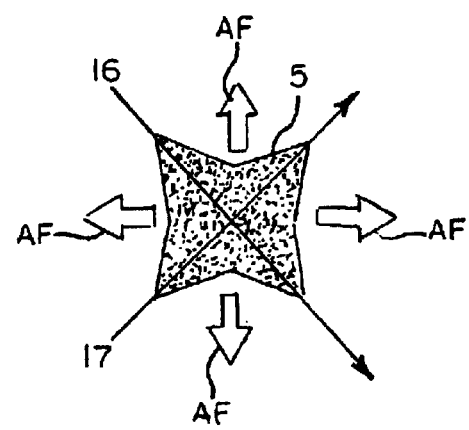
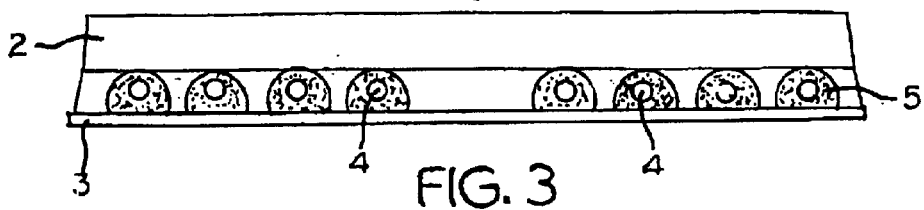
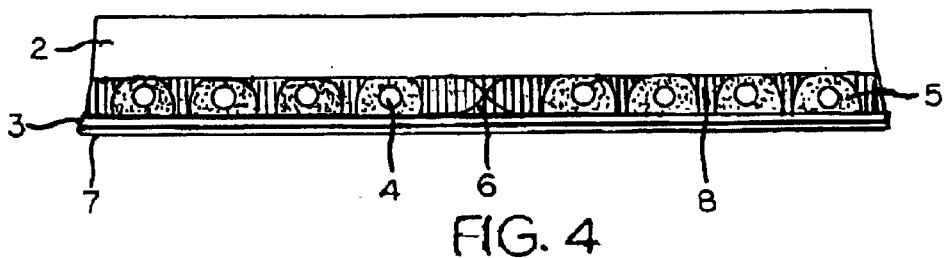

DIE ATTACH ADHESIVES FOR
SEMICONDUCTOR APPLICATIONS
UTILIZING A POLYMERIC BASE
MATERIAL WITH INORGANIC INSULATOR
PARTICLES OF VARIOUS SIZES

The invention disclosed herein deals with die attach adhesives and methods for their use, along with the devices that are obtained by the use of the methods.

Using semiconductor chips as an example, the adhesives and the method for using them provides an interface between a chip (die) and the chip support. The method includes creating a space between the chip and the chip support of a given sized opening.

BACKGROUND OF THE INVENTION

In the construction of semiconductor assemblies, it has been found that curable elastomeric materials can be used to create a space between the semiconductor and its support, such construction being disclosed in the U.S. patents of the prior art discussed infra. The most common is the assembly of one or more semiconductor chips on a substrate such as polyimide film which forms part of a chip carrier package including a circuit panel or chip housing.

A chip carrier includes a dielectric layer with an array of terminals and may also contain leads. The chip carrier is fastened to a semiconductor chip through the leads or wire bonds. An elastomeric material is disposed between the chip and the flexible dielectric layer of the chip carrier. The chip carrier and elastomeric material are also referred to as an "interposer" or "interposer layer", by those skilled in the art. The leads or wire bonds of the chip carrier are bonded to the chip so that the terminals of the carrier are electrically connected to the contacts on the chip. The entire structure can then be mounted to a substrate such as a circuit panel or chip housing. The terminals of the chip carrier are electrically connected to contacts on the substrate. The elastomeric layer provides resiliency to the individual terminals allowing each terminal to move as necessary to accommodate tolerances during testing and in the final assembly itself.

PRIOR ART

The details of the information set forth just above can be found in U.S. Pat. No. 5,477,611 which issued on Dec. 26, 1995 to Sweis, et al, which describes the manufacture of a chip device.

U.S. Pat. No. 5,148,266 which issued on Sep. 15, 1992 to Khandros, et al; U.S. Pat. No. 5,346,861 which issued on Sep. 13, 1994 to Khandros, et al, and U.S. Pat. No. 5,347,159 which issued on Sep. 13, 1994 to Khandros, et al, are based on the same essential disclosure and are also relevant for showing the component parts of chip assemblies and their current manufacturing processes. U.S. Pat. No. 5,477,611 shows the use of liquid resins to create a gap between the chip and the substrate. This material is injected as a liquid and then hardened (cured). The disclosure shows that the material, as it reaches the edges of the chip configuration, creates a meniscus along all outside edges, that are exposed to the atmosphere, which meniscus cures prior to the final cure of the interposed layer. This "B-staging" of the edge through the meniscus creates an in-situ mold that contains the liquid between the chip and the substrate until the final cure takes place.

Except for the disclosure of the use of a curable liquid as an interposer material, there is nothing in the above-mentioned patents about creating a gap between the chip and a substrate as provided by the instant invention.

With regard to the prior art dealing with the use of particulate materials as spacers creating the gap between the chip and the substrate, one should be aware of Japanese patent application number H11-193828, filed Jul. 8, 1999 in the name of Isshiki, et al, wherein there is disclosed the use of a die attach adhesive that is based on a curable polymer composition containing a spherical filler with an average particle diameter of from 100 to 1,000 μm and a major axis to minor axis ratio of from 1.0 to 1.5. What is disclosed and emphasized therein is the use of certain size particles of inorganic spherical fillers as spacers in the composition.

Likewise, Japanese patent application H11-193829, filed Jul. 8, 1999 in the name of Yamaka, et al, deals with die attach adhesives for bonding semiconductor chips to chip mounting components wherein the adhesive comprises a curable polymer composition containing a spherical filler as spacer particles with an average particle diameter of from 10 to 100 μm and a major axis to minor axis ratio of 1.0 to 1.5, and they are used in an amount in the range of about 1 to 900 ppm in those formulations.

Finally, Japanese Laid-Open Patent Application (Kokai) No. 7-292343 discloses an adhesive agent for a semiconductor device which is comprised of (A) an organopolysiloxane having at least two silicon atom bonded alkenyl groups per molecule, (B) an organopolysiloxane having at least two silicon atom bonded hydrogen atoms per molecule, (C) an organosilicon compound having a silicon atom bonded alkoxy group, (D) an organic or inorganic spherical filler whose particle diameter is 10 to 100 μm and whose major and minor diameter ratio is 1.0 to 1.5, and (E) a catalytic amount of platinum or a platinum compound.

None of the above-identified references recognized the critical parameters set forth for this invention for a successful die attach adhesive based on inorganic insulating particles as spacer beads.

BRIEF DESCRIPTION OF THE FIGURES

FIG. 1 is a drawing of a fully packaged device that can be manufactured by the use of the adhesive of this invention and is a full side view thereof.

FIG. 2 is a schematic of the dispersion of the adhesive of this invention for use in the example.

FIG. 3 shows a schematic of the die on the substrate with adhesive containing spacer beads and before the encapsulation.

FIG. 4 shows a schematic of the die on the substrate with adhesive containing spacer beads and after completion of the polymeric packaging process.

FIG. 5 is a schematic diagram of a possible dispersion of the die attach adhesive upon the application of pressure to the die as set forth in the processes of this invention.

THE INVENTION

Figure 6:
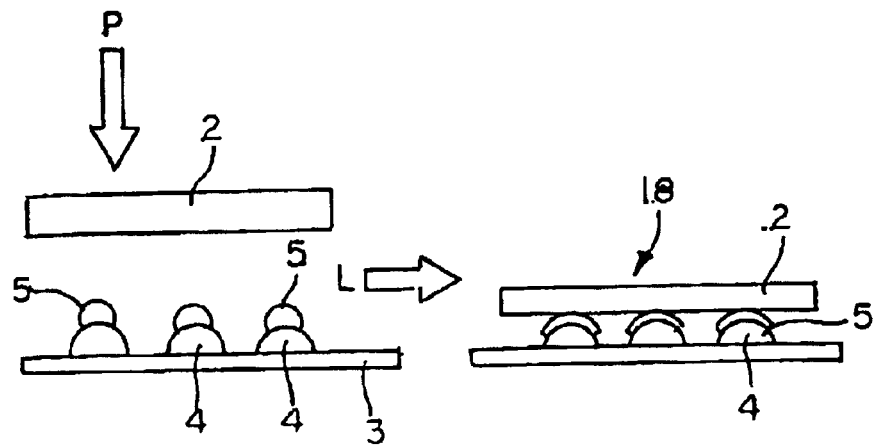
FIG. 6 is a schematic illustration of one of the methods of this invention that is the pre-cured polymeric spacer printed die method.

What is disclosed as the invention herein is an adhesive composition comprising a curable polymer and/or resin, an inorganic spacer filler in an amount sufficient to allow for good planarity between the semiconductor die and the attachment substrate, plus a low coefficient of thermal expansion filler, said combination providing optimum die attachment and provide improved chip adhesion performance.

Also, there is disclosed a method for using such adhesive to manufacture chip devices, and the disclosure of the chip devices per se. The advantage of the processes disclosed herein is that because of the nature of the die attach adhesive of this invention, there is only required two to three process steps as opposed to five or more process steps when using the methods of manufacture of the prior art.

What is disclosed and claimed herein is a curable adhesive composition comprising in combination a curable polymeric base material and contained in said polymeric base material, inorganic insulating particles having average particle sizes of 1 μm to 1000 μm and aspect ratios of the major axis to the minor axis of about 1.0 to 1.5 and, at least one low coefficient of thermal expansion filler, in an amount of at least greater than 50 weight percent, based on the amount of the curable polymeric base material, and present in sufficient quantities to obtain an adhesive with a linear thermal expansion coefficient before and after any glass transition temperature of less than 240 μm/m/° C., between −55° C. and +200° C. when measured at a heating rate of 5° C./minute, and wherein there is present less than 0.1 weight percent of the coefficient of thermal expansion filler having sizes in the range of 10 to 100 μm.

In addition, there is another embodiment of this invention that is a semiconductor device in which at least two individual substrates are joined and bonded by an adhesive composition as described just above.

Still another embodiment of this invention is a process for joining at least two individual substrates, the process comprising applying an adhesive composition as described just above to at least one surface of at least one of the individual substrates and then mounting another individual substrate to the adhesive treated side of the substrate to form a laminate. Then pressure and/or temperature is applied to the laminate to disperse the adhesive between the layers until each of the substrates contact the largest inorganic insulator particles of the adhesive composition, and thereafter, the adhesive composition is cured. It is contemplated within the scope of this invention to apply pressure and heat at the same time and eventhough the application of pressure, and of heat, can take the form of two or more steps in the process, the preferred mode is to apply the pressure and the heat simultaneously.

Turning now to the curable base adhesive composition, it is contemplated within the scope of this invention to provide any curable polymeric adhesive composition as the base material as long as the adhesive is capable of bonding the chip to any desired substrate. Such curable polymeric compositions are known in the art and can be any of a curable silicone composition; a curable epoxy composition; a curable polyimide composition, or, a curable acrylic composition. Preferred for this invention are curable epoxy and silicone compositions, and most preferred are curable silicone compositions.

Especially preferred are the compositions set forth and described in U.S. Pat. No. 5,977,226, that issued on Nov. 2, 1999 to Dent et al, and U.S. Pat. No. 4,766,176, that issued on Aug. 23, 1988 to Lee, et al, and U.S. Pat. No. 5,017,654, that issued May 21, 1991 to Atsushi, et al, the compositions of which, and the teachings for the preparation of such compositions, are incorporated herein by reference.

Low Coefficient of Thermal Expansion (CTE) fillers, for purposes of this invention can be any filler which is compatible with the formulated product and which will in addition provide a reduced coefficient of thermal expansion. Such CTE fillers are for example selected from metal oxides, such as boron nitride, aluminum oxide, aluminum nitride, and the like, and these aforementioned materials coated with polymeric materials or coupling agents, metal nitride, glass and other such inorganic electrical insulator particles. It is preferred that the particles have a size of less than 10 μm and are present in an amount greater than about 50 weight percent and in an amount sufficient to obtain an adhesive with a linear thermal expansion coefficient before and after the glass transition temperature, of less than 240 μm/m/° C. between −55° C. and +200° C. when measured at a heating rate of 5° C./minute.

The benefit of such fillers will become evident to those skilled in the art in conjunction with the information provided in the example set forth infra in this disclosure.

It should be noted by those skilled in the art that the mode of cure of the adhesive compositions of this invention is not critical, and can include cure mechanisms such as condensation reactions; addition reactions; ultraviolet radiation initiated reactions, and, free radical initiated reactions.

Preferred for the adhesive compositions of this invention are those that are cured by addition reactions and ultraviolet radiation initiated reactions, and especially preferred are those based on addition reactions, and most preferred are those based on addition reactions of the silicone compositions, wherein hydrogen bonded to silicon atoms of one molecule are added to unsaturated groups bonded on the silicon atoms of another molecule wherein the reactions are catalyzed by platinum catalysts. The platinum catalysts are preferably those set forth and disclosed in U.S. Pat. No. 4,766,176 set forth Supra.

DETAILED DESCRIPTION OF THE FIGURES

Turning now to the devices of this invention, reference should be made to FIG. 1, in which there is shown fully packaged device 1 that has been prepared using the adhesive composition and methods of this invention, wherein there is shown the die 2, the circuitry substrate 3 which can be polyimide, epoxy-fiberglass, or some other substrate, which can be either a flexible or rigid material known in the art, the spacer particle 4, which for purposes of this invention can be essentially all of the same size, or of different sizes for separate, different, multiple layers, the adhesive 5, the center lead bonds 6, the coverlay 7, the encapsulant 8, and the solder balls 9, the process for manufacturing of which can be found infra.

Figure 10:
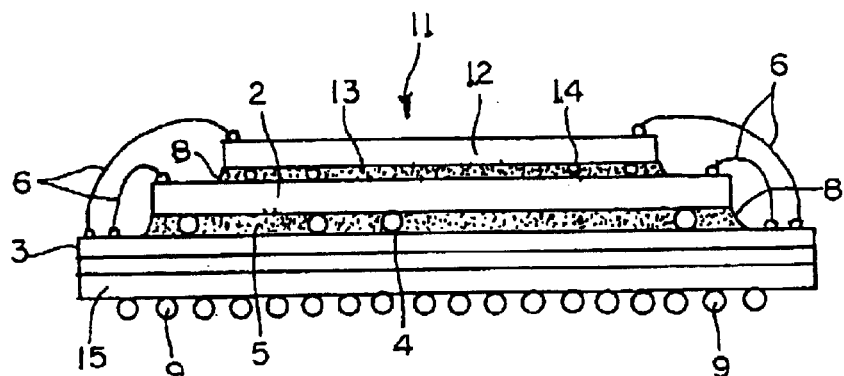
FIG. 10 is yet another device of this invention that can be manufactured by the use of the adhesive of this invention in which there is shown a full side view of a semiconductor die that has been stacked on the top of another semiconductor die in a package.

In FIG. 10, there is shown yet another device package 11 of this invention that can be manufactured by the use of the adhesive of this invention in which there is shown a full side view of another device package 11 in which one semiconductor die 12 has been stacked on the top of the semiconductor die 2 to form said package 11.

Thus, there is shown the circuitry substrate 3 which can be flexible or rigid, the die attach adhesive 5, containing the spacer beads 4 between the die 2 and the substrate 3, along with lead bonds 6, the solder balls 9, and another layer of die attach adhesive 13. The die attach adhesive 13 contains spacer beads 14, which for purposes of illustration of an embodiment of this invention said spacer beads 14 are smaller in size than the spacer beads 4 of the die attach adhesive 5. It should be noted by those skilled in the art that the average size of the spacer beads (particles) can be different between the different levels, or can be essentially the same, depending on the need of the manufacturer.

Assembly of such a device 11 is done by applying the adhesive 5 that contains the spacer beads 4, to the circuit board 15, that has been previously surmounted by the substrate circuit 3. Then, the hot die 2 is placed on the adhesive 5 with enough force to spread the adhesive 5 uniformly under the die 2. High pressures are not needed as can be observed by reviewing the viscosity of the die attach adhesive of the examples.

The heat partially cures the die attach adhesive 5 and the spacer beads 4 to provide a mechanism to control the height of the die 2 from the surface of the substrate 3. Another die 12 can then be added on top of the previously mounted die 2 by applying adhesive 13 on top of the first die 2. The top die 12 is placed hot on the adhesive 13, allowing it to partially cure to hold the parts in place for subsequent wires 6 to be furnished in the bonding operations leading from the die 12 to the substrate. Full cure of the die attach adhesives 5 and 13 is completed when an overmolding is done on top of the package 11. Once an overmolding is applied and cured, solder balls 9 are added to complete the packaging of the package 11.

In the following examples, the die attach adhesive compositions of this invention are illustrated in more detail in which, unless otherwise specified, all parts and percentages are by weight. The examples are presented to further illustrate the invention and are not to be considered as limiting the invention in any way.

Viscosity measurements were made using two methods. One method was to measure the property on the uncured composition at 25° C. using an RDA II parallel plate Rheometer with 40 mm diameter aluminum plates and 0.05% constant strain at the specified shear rates. The other method was to measure the property using a 2 cm plate at 25° C. and 1500 dyne constant force on a CP-20 Compression Rheometer from TA Instruments, Inc. located in Newcastle, Del.

Cure exotherm peak temperatures were measured using a Seiko Differential Scanning Calorimeter Model 220C by heating 20 to 25 mg. of material from 25° C. to 200° C. at 10° C./min. in an aluminum sample pan with 25 to 30 cc/min helium gas (High Purity compressed helium, UN1046 from Airgas, Inc., Radnor, Pa.), purge, and an empty aluminum sample pan as a reference. (Seiko Instruments, Torrance, Calif.)

The suppliers supplied all particle sizes and surface areas of the fillers used herein. Surface area of the fillers was measured by the Quantachrome Monosorb B.E.T. method.

The inorganic spacer particles used herein were separated using Tyler Gold Series full height 8-inch diameter wire mesh sieves with openings as specified.

Modulus at break, elongation at break, and tensile strength at break were determined in the following manner: tensile bars were cut from molded slabs and were tested at a pull speed of 20 in./min. on a Monsanto Tensometer 2000 with a 1 kN load cell. This procedure is described in detail in ASTM D412 using the 0.25 inch width die to cut the tensile bars.

The volume resistivity was measured at room temperature using a guarded electrode method described in ASTM D257-99.

Specific Gravity measurements were taken using a wet/dry balance technique outline per ASTM D792. Test samples were molded, cured, and cut into slabs of approximately one inch by one inch.

Durometer testing was performed per ASTM D2240 using a Shore A Durometer and a 71200 Conveloader, both from the Shore Instrument Manufacturing Company. Samples for test were molded, cured, and cut into slabs of approximately one inch by one inch and then stacked to greater than 0.25 inches prior to measuring the durometer.

Dielectric Constant and Dissipation Factors were measured at the specified frequency using a model 1615-A (Schering type) capacitance bridge, Type 722D condenser, Model 1316 oscillator, Type 1690 solid sample holder, and Type 1401 NIST Air Capacitance standard, all purchased from General Radio Co., Poway, Calif. These measurements were made per ASTM D150 using cured molded slabs.

Dielectric Strength of the samples was measured per ASTM D149 using a 110 kV Hypot machine Model No. 4862M2 purchased from Associated Research, Inc, Lake Forest, Ill. Cured molded slabs were used for this testing.

Linear coefficient of thermal expansion (CTE) results were gathered with a TA Instruments Model 2940 TMA (Thermomechanical Analyzer) using a 100 cc/min nitrogen purge at a 5° C./min. heating rate from 25° C. to 200° C. The test sample was molded, cured, and then cut using a 0.25 inch diameter die.

Modulus, elongation, tensile strength, volume resistivity, specific gravity, durometer, dielectric constant, dissipation factor, dielectric strength, and CTE test samples were all taken from molded slabs of 10 inch wide by 10 inch long by 0.090 inches thick, that were cured for 1 hour at 150° C. in a Dake Press at 10 tons pressure using aluminum chase molds. Samples were cut from these molded slabs as indicated or per ASTM standards relating to each test.

Placement of adhesive for die placement performance testing was performed by dispensing, printing, or placement of small amounts on a substrate using a 0.25 inch wide stainless steel spatula If dispensing of uncured adhesive was performed, a CAM/ALOT 1818 dispenser (Camalot Systems, Inc., Haverhill, Mass.) was used. If printing of uncured adhesive was performed, a Speedline MPM (Speedline Technologies, Inc., Franklin, Mass.) Model SPM Printer was used.

EXAMPLES

Example 1

This example demonstrates the preparation of one of the compositions according to the present invention.

The following components (a) and (b) were heated to the indicated temperature and then mixed one hour until uniform at 25° C. while the mixture slowly cooled to comprise Blend A at 60° C.:

(a) 99.66 parts of trimethylsiloxy-terminated dimethylmethylhydrogen siloxane containing an average of five $HMeSiO_{2/2}$ units and three $Me_2SiO_{2/2}$ units per molecule and having a viscosity of $4.8 \times 10^{-3}$ Pa·s and, (b) 1.98 parts of 2-phenyl-3-butyn-2-ol.

The example adhesive composition consisted of the following components:

(c) 466.39 parts of a resin consisting essentially of $\{(CH_3)_2CH_2=CHSiO\}_{1/2}$ units, $\{(CH_3)_3SiO\}_{1/2}$ units, and SiO$_{4/2}$ units, wherein the mole ratio of total triorganosiloxane units to SiO$_{4/2}$ units is about 0.7:1

(d) 88.83 parts of a dimethylvinylsiloxy-terinated polydimethylsiloxane having an average degree of polymerization of 830 and a viscosity of 55 Pa·s, (e) 1027.58 parts of a dimethylvinylsiloxy-terminated polydimethylsiloxane having an average degree of polymerization of 434 and a viscosity of 2 Pa·s, (f) 18.6 parts of carbon black powder having an average particle size of 45 nanometers, (g) 92.4 parts of Blend A from above, (h) 180 parts of polydimethylsiloxane fluid-treated fumed silica, (i) 3600 parts of spherical fused silica having an aspect ratio between 1.0 and 1.5 and an average particle size of 0.0045 inches±0.0005 inches, 450 parts of spherical fused silica with an average size of 0.10 mm and an aspect ratio between 1.0 and 1.5 which had been collected between a 125 micron sieve and a 106 micron sieve, (k) 76.2 parts of a platinum complex of 1,3-diethenyl-1,1,3,3-tetramethyldisiloxane.

Components (c), (d), (e), (f), (h), and (i), were added to a shear mixer and blended uniformly. The mixture was then heated to 150° C. while stirring continued. The mixture was held at this temperature for one hour, and the mixture was then cooled to less than 50° C. as mixing continued. Components (g), (j), and (k) were then added with the previous ingredients between 25° C. and 50° C.° using adequate mixing to obtain a homogeneous blend of all components to provide the final adhesive. The test results can be found on TABLE I.

Among other packaging substrates, the adhesive described was used to assemble a Tessera TV-62 center lead bond μBGA® daisy chain silicon test die (Tessera Inc., San Jose, Calif.) to a circuitry substrate 3 (in this case, polyimide TAB tape substrates) for reliability testing. FIG. 2 shows a schematic of the adhesive pattern as it was printed through a 0.006 inch thick stainless steel stencil with 0.025 inch diameter laser cut holes located where the adhesive 5 was to be deposited on to the circuitry substrate 3 (in this case, polyimide TAB tape). The printed dots 10 of die attach adhesive 5 are approximately 0.030 inches in diameter. They are printed on top of the polyimide TAB tape circuitry substrate 3 and then the die 2 is placed on top of the uncured adhesive dots 10 at approximately 200° C. for 500 milliseconds of dwell time with sufficient force (high pressures are not needed as can be observed by reviewing the viscosity of the die attach adhesive of the examples) as to bring the die 2 into intimate contact with the spacer beads 4 within the adhesive 5. The die 2 is placed in position O as shown in FIG. 2 by the dotted line. The heat during the die 2 placement partially cures the adhesive 5 holding it in place until post cure occurs.

FIG. 3 shows a clear schematic drawing of the die 2 placed on the polyimide TAB tape circuitry 3 with the spacer 4 within the filled silicone adhesive 5 holding the die 2 at a specific height off the surface of the polyimide TAB tape circuitry substrate 3.

FIG. 4 shows the die 2 after completion of the polymeric packaging process. After the die 2 is attached, thermosonic lead bonding was then performed to bond the center lead bonds 6 to the die 2. A removable tape 7 (coverlay) was placed on the bottom of the polyimide TAB tape circuitry substrate 3 to prevent encapsulant 8 from flowing through when it was applied. Following lead bonding, Dow Corning® 6820 Microelectronic Encapsulant 8 (a silicone encapsulant with linear Coefficient of Thermal Expansion (CTE) from 50° C. to 150° C.=195 ppm/° C.) was dispensed at 25° C. to flow under and around the die 2. Once the encapsulant 8 had fully flowed under and around the die 2, the entire composite package 1 was heated for one hour at 150° C. to post cure the die attach adhesive 5 and to fully cure the encapsulant 8. Then the coverlay 7 was removed. Finally, after all the polymeric packaging materials were cured, solder balls 9 were placed on the bottom side of the polyimide TAB tape circuit substrate 3 to complete the package as shown in FIG. 1.

Testing of the package as shown in FIG. 1 under environmental stress yielded the results observed in Table II. Additionally, dispensing showed very little tailing, and printing could be done at many different print speeds and pressures obtaining excellent results at each. (Method= urethane squeegee, 20 inch by 20 inch stencil frame, 0.006 thick stencil, 0.025 inch holes, pressures from 8 to 30 lbs., and speeds from 1 inch/min. to 2 inch/second). Die 2 height was controlled to 0.005 inches with less than 0.0005 inches variation between packages made for the reliability testing.

In addition to dispensing or printing small dots 10 of adhesive and filling the remaining area under the die with an encapsulant 8, the entire area under the die could be filled with die attach adhesive 5 eliminating much of the time needed for the encapsulation material flow under the die during the encapsulation step. If an "X" shaped pattern such as that shown in FIG. 5 is made by dispensing one diagonal line 16, and then another diagonal line 17 crossing the first line 16, the die attach adhesive 5 forms a mound in the middle which could then be pressed out to the edges of the die 2 if appropriate amounts of adhesive are used. The arrows labeled "AF" show the direction of the secondary flow of the die adhesive 5. Many patterns could be used depending upon the shape of the die.

Adjusting the silica filler levels allows for various die application pressures to be used depending upon the package type.

Comparative Example

The following example illustrates the significant processing steps that can be eliminated from the device packaging process of the prior art using the processes of this invention, yet allow excellent reliability of packaged parts.

Device packages have been built using printed silicone spacers. However, die attach adhesive must be printed on the spacers or dispensed between the spacers in order to attach the die. Pad adhesives require extra steps to remove liners used therein. The following "PROCESS STEPS TABLE" shows the process steps that can be eliminated if the compositions of this invention are used instead of the standard device packaging products from the prior art.

There are essentially four prior art methods of performing die attach, one of which will not be dealt with herein because the method uses die attach materials without spacer beads. All of the prior art processes using such methods must control the height of the die from the circuit substrate to insure that lead bond reliability remains high. The shape of the lead is directly related to the reliability, and the height from the substrate controls the shape of the lead. The methods set forth below illustrate the die attach adhesives of this invention.

In the first method, the pre-cured polymeric spacer printed die attach method, and with reference to FIG. 6, spacers 4 are printed and then cured, and then die attach adhesive 5 is printed on top of the cured spacers 4. Pressure P is applied to the die 2 as it is surmounted on the die attach adhesive 5. Also shown in FIG. 6, for orientation purposes, is the polyimide substrate 3, the die 2, and there is also shown a lateral moving arrow L, moving to the right of the Figure to show the direction of movement of the assembly line to provide the final product 18.

Figure 7:
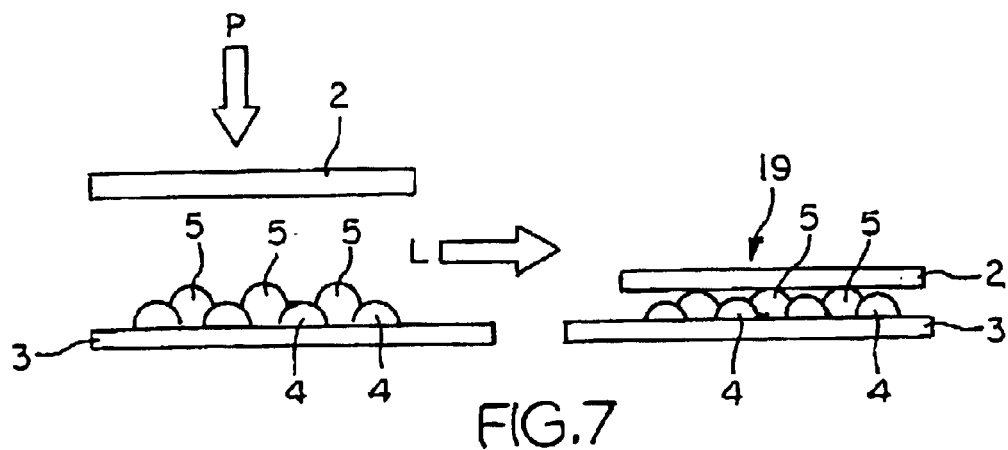
FIG. 7 is a schematic illustration of another method of this invention that is the pre-cured polymeric spacer dispersed die method.

The second method, the pre-cured polymeric spacer dispensed die attach method, is the use of spacers 4 that are printed and then the die attach adhesive 5 is dispensed on top and surrounding the cured spacers. See FIG. 7 wherein there is shown the die 2, the printed spacers 4, and the uncured dispensed die attach adhesive 5 surrounding the printed spacers 4. The final product is shown as 19.

Figure 8:
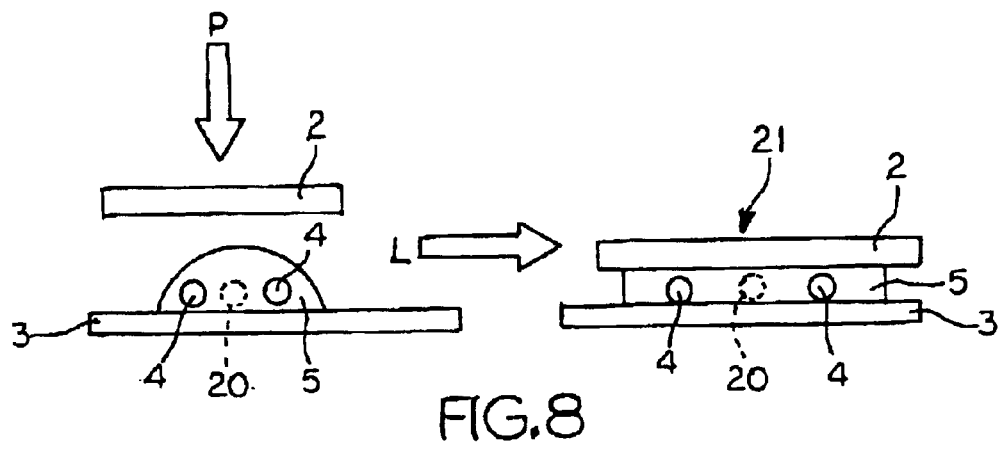
FIG. 8 is a schematic illustration of another method of this invention that is the printed or dispensed die attach pad method.

The third method, the printed or dispensed die attach pad method, and a very popular method, is the use of a pad adhesive. With reference to FIG. 8, there is shown the spacer beads 4, the pad of adhesive 5, a spacer 20 that is not in planer alignment with the spacer beads 4, the polyimide film 3, and the finished product 21.

Figure 9:
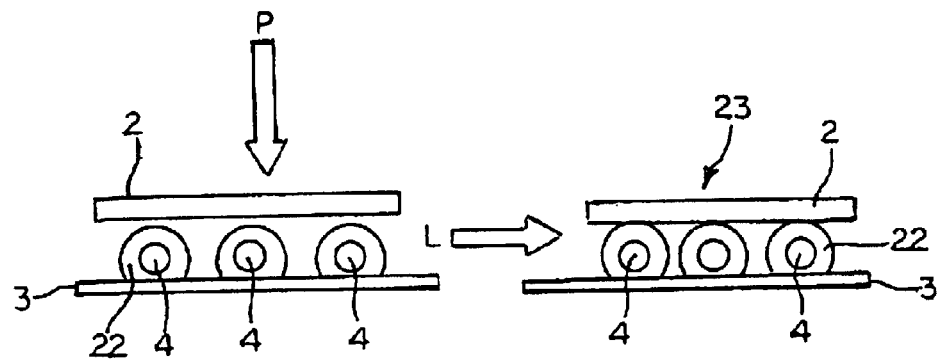
FIG. 9 is a schematic illustration of yet another method of this invention that is the printed or dispensed segmented pad method.

The fourth method, the printed or dispensed segmented pad method can be found illustrated in FIG. 9, wherein uncured stencil printed die attach dots 22 are placed on the polyimide film 3. Thereafter, the die 2 is pressed onto the adhesive and is stopped a predetermined distance from the polyimide film by the spacers 4. The composite is then cured to give the product 23.

When these methods are used in the prior processes it can be observed from the following PROCESSING STEPS TABLE that there are more process steps, or there are major inadequacies of the method, and they tend to take more time to execute. The compositions of the instant invention do not require the extra steps, nor the length of time to execute the steps necessary to obtain a die attach, or do not suffer from the complications of regulating time, temperature, pressure and the rheology of the base material. The die attach adhesive 5 can be applied as dots, by dispensing or printing the dots, or dispensed to form a pad and the heat and pressure can be applied simultaneously. The inventive methods herein are shown in the PROCESSING STEPS TABLE as A and B, it being understood that the prior art methods could also be used with the inventive compositions of this invention.

TABLE I

| property measured | value observed |
| --- | --- |
| Viscosity @ 1 radian/sec | 220,600 poise |
| Cure Exotherm Peak Temperature | 121.3° C. |
| Linear Coefficient of Thermal Expansion from 50° C. to 150° C. | 154 ppm/° C. |
| Tensile Strength at Break | 1310 psi |
| Elongation at Break | 25.3 percent |
| Modulus @ 25% elongation | 30.5 psi |
| Specific Gravity | 1.52 |
| Durometer | 91.5 Shore A |
| Dielectric Constant 100 Hz | 2.9 |
| Dielectric Constant 100 kHz | 2.9 |
| Dissipation Factor 100 Hz | 0.0004 |
| Dissipation Factor 100 kHz | <0.0002 |
| Volume Resistivity | $1.4 \times 10^{15}$ ohm-cm |
| Dielectric Strength | 507 V/mil |

TABLE II

| TEST | TEST DESCRIPTION | QUANTITY TESTED | RESULTS |
| --- | --- | --- | --- |
| Preconditioning | 24 hour 125° C. bake, 168 hrs. 85° C./85% RH soak[4], 3 × reflow at 220° C.(EIA/JEDEC Standard JESD22-A113-B[6]) | 38 | 0 failures |
| Temperature Cycle on FR-Board[1] | −40° C. to 125° C.[5], cycle to 50% failure | 30 | 0 failures[2]/250 cycles<br>0 failures[2]/500 cycles<br>0 failures[2]/750 cycles<br>0 failures[2]/1000 cycles<br>0 failures[2]/1250 cycles<br>0 failures[2]/1500 cycles |
| Temperature Cycle Package Only | −55° C. to 125° C.[3] | 8 | 0 failures[2]/250 cycles<br>0 failures[2]/500 cycles<br>0 failures[2]/750 cycles<br>0 failures[2]/1000 cycles |

[1]Package solder balls reflowed attaching the package to an epoxy fiberglass (FR-4) board simulating actual usage.
[2]Failure is defined as an open or short when voltage is applied.
[3]MIL-STD-883 1010.7 Temperature Cycling Test Method Test Condition B.
[4]10 minute soak times are used at each temperature extreme with testing of each electrical I/O for shorts at indicated times.
[5]MIL-STD-883(modified test condition per specification)
[6]Joint Electron Devices Engineering Council

PROCESS STEPS TABLE (a comparison of the prior art methods to the methods
of the inventive process disclosed and claimed herein)

| Step No. | Print Spacers/ Print Die Attach | Print Spacers/ Dispense Die Attach | TYPE OF PROCESS Use Pad Adhesive | A* As Dots | B** As Pad |
|---|---|---|---|---|---|
| 1 | Print Spacers | Print Spacers | Remove liner | Print Spacers | Dispense Adhesive |
| 2 | Cure Spacers | Cure Spacers | Punch or Place Adhesive | Attach hot die | Attach Hot die |
| 3 | Print die attach | Dispense die attach | Apply pressure and/or heat | | |
| 4 | Attach hot die | Attach hot die | Remove liner | | |
| 5 | | | Attach hot die | | |

*A is a composition of this invention wherein dots are used as the spacer material.
**B is a composition of this invention wherein pads are used as the spacer material.

What I claim is:

1. A curable adhesive composition comprising in combination:
   a curable polymeric base material and contained in said polymeric base material,
   (I) inorganic insulator particles having average particle size of 1 $\mu$m to 1000 $\mu$m and a major axis to minor axis ratio of about 1.0 to 1.5, said inorganic insulator particles being present in the composition in an amount sufficient to provide a planar adhesive bond thickness between substrates being joined by said adhesive, and
   (II) at least one low coefficient of thermal expansion filler having an average particle size of less than 10 $\mu$m in an amount of at least greater than 50 weight percent based on the weight of the curable polymeric base material, wherein the low coefficient of thermal expansion fillers having sizes of greater than 10 to about 100 $\mu$m are present in less than 0.1 weight percent based on the total weight of the low coefficient of thermal expansion fillers present in the adhesive composition.

2. A curable adhesive composition as claimed in claim 1 wherein the inorganic insulator particles are fused silica particles.

3. A curable adhesive composition as claimed in claim 1 wherein the inorganic insulator particles are alumina particles.

4. A semiconductor device in which at least two individual substrates are joined and bonded by an adhesive composition as claimed in claim 1.

5. The semiconductor device as claimed in claim 4 wherein the two individual substrates are a semiconductor die and an attachment substrate for the semiconductor die.

6. A process for joining at least two individual substrates, said process comprising:
   (I) applying an adhesive composition as claimed in claim 1 to at least one surface of at least one of the individual substrates;
   (II) mounting another individual substrate to the adhesive treated side of the substrate of (I) to form a laminate thereof;
   (III) applying pressure to the laminate to disperse the adhesive therebetween until each of the substrates contact the largest organic insulator particles of the adhesive composition, and thereafter,
   (IV) curing the adhesive composition.

7. The process as claimed in claim 6 wherein additionally, heat is applied in step (III).

8. The process as claimed in claim 6 wherein the two individual substrates are a semiconductor die and an attachment substrate for the semiconductor die.

9. The adhesive composition as claimed in claim 1 wherein the adhesive base material is selected from the group consisting essentially of:
   (a) a curable silicone composition;
   (b) a curable epoxy composition;
   (c) a curable polyimide composition, and,
   (d) a curable acrylic composition.

10. An adhesive composition as claimed in claim 9, having a cure mechanism selected from the group consisting essentially:
    (ii) condensation reactions;
    (iii) addition reactions;
    (iv) ultraviolet initiated radiation reactions, and,
    (v) free radical initiated reactions.

11. An adhesive composition as claimed in claim 9 wherein the adhesive base material is a silicone composition.

12. An adhesive composition as claimed in claim 11 wherein the silicone composition is an addition reaction curable silicone composition.

13. An adhesive composition as claimed in claim 9 wherein the adhesive base material is an epoxy composition.

14. A semiconductor device in which at least two individual substrates are joined and bonded by a curable adhesive composition, said curable adhesive composition comprising in combination a curable polymeric base material and contained in said polymeric base material,
    (I) inorganic insulator particles having an average particle size of 1 $\mu$m to 1000 $\mu$m and a major axis to minor axis ratio of about 1.0 to 1.5, said inorganic insulator particles being present in the composition in an amount sufficient to provide a planar adhesive bond thickness between substrates being joined by said adhesive, and
    (II) at least one low coefficient of thermal expansion filler having an average particle size of less than 10 $\mu$m in an amount of at least greater than 50 weight percent based on the weight of the curable polymeric base material, wherein the low coefficient of thermal expansion fillers having sizes of greater than 10 $\mu$m to about 100 $\mu$m are present in less than 0.1 weight percent based on the total weight of the low coefficient of thermal expansion fillers present in the adhesive composition.

\* \* \* \* \*